United States Patent

Dietz et al.

[11] Patent Number: 6,159,796
[45] Date of Patent: *Dec. 12, 2000

[54] METHOD OF FORMING A NON-VOLATILE MEMORY CELL HAVING A HIGH COUPLING CAPACITANCE INCLUDING FORMING AN INSULATOR MASK, ETCHING THE MASK, AND FORMING A U-SHAPED FLOATING GATE

[75] Inventors: Guido Wolfgang Dietz, Haar; Andreas Graf Von Schwerin, München, both of Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 09/126,174

[22] Filed: Jul. 30, 1998

[30] Foreign Application Priority Data

Jul. 30, 1997 [DE] Germany ............................ 197 32 870

[51] Int. Cl.[7] .................................................. H01L 21/336
[52] U.S. Cl. .......................... 438/257; 438/259; 438/300
[58] Field of Search ........................................ 257/314–324, 257/327; 438/257–265, 238, 300

[56] References Cited

U.S. PATENT DOCUMENTS

| 4,979,004 | 12/1990 | Esquivel et al. . | |
| 5,281,548 | 1/1994 | Prall | 257/315 |
| 5,315,142 | 5/1994 | Acovic et al. . | |
| 5,472,893 | 12/1995 | Iida . | |
| 5,474,947 | 12/1995 | Chang et al. | 438/257 |
| 5,543,339 | 8/1996 | Roth et al. . | |
| 5,576,567 | 11/1996 | Mori . | |
| 5,726,081 | 3/1998 | Lin et al. | 438/163 |
| 5,965,913 | 10/1999 | Yuan et al. | 257/321 |
| 5,981,338 | 11/1999 | Lee | 438/257 |

FOREIGN PATENT DOCUMENTS 0 562 307 A2   9/1993   European Pat. Off. .

OTHER PUBLICATIONS

Japanese Patent Abstract No. 63229860 (Takao), dated Sep. 26, 1988.
Japanese Patent Abstract No. 03034581 (Akihiro), dated Feb. 14, 1991.

*Primary Examiner*—Charles Bowers
*Assistant Examiner*—William M. Brewster
*Attorney, Agent, or Firm*—Herbert L. Lerner; Laurence A. Greenberg; Werner H. Stemer

[57] ABSTRACT

In a non-volatile memory cell having a floating gate (EEPROM), it is necessary to achieve a large coupling capacitance between the floating gate and a control gate in which the gates take up as little space as possible. To that end, it is provided that a dielectric between the floating gate and the control gate runs, in portions, approximately perpendicularly to the surface of a semiconductor substrate, for example, with the control gate configured within a U-shaped or pot-shaped floating gate.

11 Claims, 8 Drawing Sheets

METHOD OF FORMING A NON-VOLATILE MEMORY CELL HAVING A HIGH COUPLING CAPACITANCE INCLUDING FORMING AN INSULATOR MASK, ETCHING THE MASK, AND FORMING A U-SHAPED FLOATING GATE

BACKGROUND OF THE INVENTION

Field of the Invention

The invention relates to a semiconductor structure. The semiconductor structure includes a semiconductor substrate formed of a first conduction type; first and second doped regions formed of a second conduction type disposed in the semiconductor substrate; a channel region with a surface formed in the semiconductor substrate separating the first and second doped regions; an insulation zone laterally surrounding the doped regions and the channel region; a floating gate disposed in an insulated manner on the surface of the channel region; a control gate disposed on a side of the floating gate remote from the channel region; and a dielectric layer insulating the control gate from the floating gate. The semiconductor structure of this type constitutes a non-volatile memory, a so-called EEPROM cell.

Such a memory cell is programmed (i.e. written to and erased) by the application of a potential to the externally connected control gate, which is capacitively coupled to the non-connected floating gate. A short programming time necessitates a large capacitive coupling between the floating gate and the control gate.

The realization of a large capacitance between the floating gate and the control gate is associated with a large space requirement in known cell configurations in which the control gate is configured in a planar manner on the floating gate. A sufficiently large coupling capacitance is achieved by the lateral extent of the floating gate being much greater than the extent of the active zone (that is to say of the doped regions and the intervening channel region) of the cell. The requisite area is typically about 3 times as large as a channel region, and the integration level in a memory configuration having a multiplicity of neighboring memory cells of this type is thereby limited.

SUMMARY OF THE INVENTION

It is accordingly an object of the invention to provide a non-volatile memory cell having a high coupling capacitance and a method for fabricating a semiconductor structure which overcome the above-mentioned disadvantages of the prior art devices and methods of this general type, in which a reduced space requirement is achieved without reducing the coupling capacitance between the floating gate and the control gate. A further object is to specify a method for fabricating a semiconductor structure of this type.

With the foregoing and other objects in view there is provided, in accordance with the invention, a semiconductor structure, including: a semiconductor substrate with a first conduction type; first and second doped regions disposed in the semiconductor substrate and having a second conduction type; a channel region having formed in the semiconductor substrate, separating the first and second doped regions and having a surface; a geometrical connecting line running between the doped regions defining a first direction; an insulation zone laterally surrounding the doped regions and the channel region; a floating gate disposed in an insulated manner on the surface of the channel region; a control gate disposed on a side of the floating gate remote from the channel region and the control gate runs in a second direction; a dielectric layer insulating the control gate from the floating gate; and the control gate and the floating gate have surfaces adjoining the dielectric layer, a portion of the surfaces run essentially perpendicular to the surface of the channel region.

The basic concept of the invention involves folding the floating gate and the control gate into one another rather than configuring them in a planar manner, one above the other.

The dielectric separating them and the capacitively effective surfaces of the floating gate and of the control gate which face the dielectric layer are not situated exclusively in a plane parallel to the surface of the substrate, but rather have at least one portion which forms an angle with the surface. The angle is approximately 90° in order to achieve the most effective folding possible, that is to say the largest possible capacitively effective surface relative to the base area taken up.

In accordance with an added feature of the invention, the control gate has side walls, the dielectric layer covers at least part of the side walls, and the floating gate extends along the at least part of the side walls covered by the dielectric layer.

In accordance with an additional feature of the invention, the floating gate is U-shaped, and the control gate is disposed within the U-shaped floating gate.

In a preferred embodiment, the floating gate is folded upward at two opposite sides in the first direction, the sides facing the source and the drain, the floating gate thereby having a U-shaped cross section. The inner walls of the "U" are lined with the dielectric. The control gate runs within, preferably completely within, the trench formed by the floating gate.

The capacitance is composed of the contributions of the bottom and of the side walls and can therefore be increased by increasing the side walls upward extent, without a larger base area being taken up. The floating gates of neighboring cells are separated by the first insulating layer whose thickness preferably corresponds to the total height of the floating gate. Above the insulation zone adjoining the channel region in the second direction, the first insulating layer has a trench which adjoins the trench formed by the floating gate. The control gate can then run within the trench.

In a second embodiment, the floating gate is folded upward on all sides. The floating gate thereby having a pot-shaped configuration. The inner walls of the pot are lined with the dielectric. The control gate runs across the upper edge of the floating gate and projects inside the pot. In this case, that part of the control gate which fills the pot may be composed of a different material from that part which runs over it, or both parts may be produced from the same material.

The capacitively effective surfaces may also be folded multiple times, with the result that the floating gate is configured in a pot-shaped or U-shaped manner with internal lamellae extending upward and with a comb-shaped cross section. Such lamellae can be produced as spacers in a known manner.

In accordance with another feature of the invention, the floating gate covers only the channel region, taking alignment tolerances into account.

The control gate must be prevented from running over the channel region directly or separated only by the dielectric. In the case of the first embodiment, for example, this can be achieved in that the floating gate reliably covers the channel region. That is to say, it extends in particular in the second direction as far as the boundary between the channel region and the insulation zone. The control gate is then separated from the channel region by the floating gate and the dielectric. In order to minimize the space requirement, on the one hand, it is desirable for the floating gate to cover the insulation zone slightly at the most and for the distance from the neighboring floating gate in the second direction to be minimized. If the floating gate is fabricated by lithography, its minimum width is predetermined by the structure fineness F that can be achieved. The alignment error that must be taken into account is usually F/3. Complete coverage of the channel region by the floating gate is ensured by the fact that the extent of the floating gate in the second direction is 5/3 F and the distance between neighboring floating gates is F, with the result that the grid spacing in this direction is 2 2/3 F.

In accordance with a further added feature of the invention, the control gate has a vertical extent above the insulation zone, the floating gate has a vertical extent above the channel region, the control gate has a vertical extent above the channel region, and the vertical extents are equal in height.

In accordance with a further additional feature of the invention, the floating gate is pot-shaped and the control gate is disposed at least partially within the pot-shaped floating gate.

In accordance with yet another feature of the invention, the floating gate is U-shaped with opposite side walls running in the second direction and extending upward, and the control gate is disposed at least partially within the U-shaped floating gate.

In accordance with yet another added feature of the invention, an extent of the floating gate in the first and second directions is equal to a minimum fabricatable structure fineness F.

With the foregoing and other objects in view there is also provided, in accordance with the invention, a method for fabricating a semiconductor structure, which includes: a) forming a semiconductor substrate of a first conduction type; b) forming an active region by disposing first and second doped regions separated from each other by a channel region in the semiconductor substrate, and defining a first direction as a geometrical connecting line running between the doped regions; c) laterally surrounding the doped regions and the channel region with an insulation zone; d) fabricating a floating gate, including the steps of: d1) applying a first conductive layer to a surface of the insulated semiconductor substrate and patterning the first conductive layer using a first mask; d2) applying a first insulating layer over the whole insulated semiconductor substrate including the first mask; d3) forming a hole in the first insulating layer by uncovering a surface of the first mask and then removing the first mask, the hole uncovering a surface of the first conductive layer; and d4) applying a second conductive layer to the uncovered surfaces of the first insulating layer defining the hole; e) applying a dielectric layer to a surface of the second conductive layer; f) applying a third conductive layer to a surface of the dielectric layer completely filling the hole; and g) fabricating a track including a control gate running in a second direction from the third conductive layer.

In order to fabricate the structure, provision is made for applying the first conductive layer to the substrate provided at least with a gate dielectric and with an insulation zone which leaves the doped region free, and for patterning the first conductive layer lithographically with the aid of a first mask. The first conductive layer can either be patterned to form a track which runs in the second direction over the active zone, namely over the channel region, and the adjoining insulation zone or runs over the neighboring channel regions in the second direction given a multiplicity of cells to be formed. However, the first conductive layer can also be patterned already in a manner corresponding to the lateral dimensions of the floating gate (second embodiment), with the result that it does not run continuously over neighboring cells. The dimensions are preferably F×F.

The first mask used for patterning is preferably a hard mask made, for example, of silicon nitride or silicon oxide. It initially remains on the configuration and must therefore be compatible with the subsequent process steps. The thickness of the mask determines the maximum possible height of the side walls of the floating gate.

A first insulating layer is applied, preferably over the whole area with subsequent planarization, with the result that the surface of the first mask is uncovered and preferably lies in a plane with the surface of the first insulating layer. The first insulating layer must be composed of a different material from the first mask, for example of silicon oxide or silicon nitride. The first mask is removed, producing a trench-shaped or pot-shaped hole in the insulating layer, the side walls of which hole are formed by the first insulating layer and the bottom of which hole is formed by the first conductive layer.

A second conductive layer is applied at least on the side walls of the hole. The layer being deposited over the whole area and etched back, for example. The second conductive layer does not fill the hole and is preferably composed of the same material as the first conductive layer.

In the case of a trench-shaped configuration of the hole, the first and second conductive layers must be etched with the aid of a second mask in order to isolate neighboring floating gates in the second direction from one another. The etching is preferably effected such that the conductive layers reliably cover the channel region, otherwise the uncovered channel region must be insulated in a suitable manner. The second mask and the etching process are not necessary if the first conductive layer and thus the hole already have the dimensions of the floating gate to be fabricated. Since, in this case, the hole is surrounded on all sides by the first insulating layer, the control gate cannot run over the channel region in a manner separated only by the dielectric. The floating gate can therefore have a size of F×F.

A floating gate having a U or pot-shaped cross section is produced in this way. If the floating gate is to be formed with a comb-shaped cross section, insulating and conductive spacers are alternately produced on the hole walls and the insulating spacers are removed again.

The inner wall is covered with a dielectric, for example by whole-area application of the ONO layer. Finally, the remaining hole is filled with a third conductive layer which forms the control gate. In the case of a U-shaped floating gate in a trench which continues in the first insulating layer via the neighboring insulation zone in the second direction, the control gate can run completely within the trench. In the case of a pot-shaped floating gate, part of the control gate extends into the hole, and neighboring floating gates are connected to one another by a part of the control gate which runs over the edge of the floating gate. The two parts of the control gate can be fabricated simultaneously or separately, and also from different materials.

The doped regions, the source and the drain, can be fabricated either at the beginning of the process or after the etching of the first conductive layer. To that end, spacers preferably made of the same material as the first insulating layer are fabricated on the side walls of the first mask and of the first conductive layer and then the regions are implanted. The further procedure is as described above.

In a third embodiment, the semiconductor structure has a U-shaped floating gate. The side walls are folded upward at the opposite edges of the floating gate in the second direction. The trench formed by the floating gate runs in the first direction, and the control gate running in the second direction must be routed across the side walls of the floating gate. In the course of fabricating the floating gate, it is preferred that the first conductive layer to be patterned with the first mask to form a track running in the first direction over the active zone, and the insulation zone essentially remaining free. The side walls are formed in the manner described above. The third conductive layer is applied over the whole area and patterned with a further mask to form the control gate running in the second direction. The underlying dielectric and the first conductive layer are etched using the same mask, thereby uncovering the source and drain regions to be doped in the active zone. Insulating spacers are fabricated on the side walls of the structure produced in this way and then source and drain are implanted.

In the third embodiment, the floating gate can have the dimension F in each case in the first and in the second direction, even when alignment errors are taken into account. In the event of an offset of the first mask in the second direction, the floating gate overlaps the insulation zone on one side and does not completely cover the channel region on the other side. However, the uncovered channel region is covered later, as in the case of the second embodiment, by the first insulation layer, with the result that the electrical function of the cell is not adversely affected. An offset of the mask for defining the control gate is likewise not critical since the mask is used to define both floating gate and control gate simultaneously and the source and the drain.

In accordance with an added feature of the invention, there are the steps of performing step d1) by patterning the first conductive layer with the aid of the first mask to form a further track running in the second direction over the channel region; and after performing step d4), etching the second conductive layer and the underlying first conductive layer with the aid of a second mask covering the channel region.

In accordance with an additional feature of the invention, there is the step of forming insulating spacers on sides of the first mask and of the first conductive layer and aligning the doped regions after the patterning of the first conductive layer.

In accordance with another feature of the invention, there are the steps of performing step d1) by patterning the first conductive layer with the aid of the first mask to form a another track running in the first direction over the active region; and etching the third conductive layer, the dielectric layer and the first conductive layer with the aid of a further mask corresponding to a configuration of the control gate for fabricating the control gate.

In accordance with a further added feature of the invention, there is the step of applying a further conductive layer on the third conductive layer for connecting neighboring cells to one another as part of the control gate.

In accordance with yet another additional feature of the invention, there is the step of producing the first mask from silicon nitride and the first insulating layer from silicon oxide.

In accordance with yet another feature of the invention, there is the step of producing the first mask from silicon oxide and the first insulating layer from silicon nitride.

In yet another added feature of the invention, there is the step of uncovering the surface of the first mask by a planarization process.

In accordance with a further additional feature of the invention, there is the step of forming the first and the second conductive layers of a same material.

In accordance with a further additional feature of the invention, there is the step of forming the third conductive layer from a material selected from the group consisting of polysilicon, WSi, TiN and tungsten.

In accordance with a concomitant feature of the invention, there is the step of setting a coupling capacitance between the floating gate and the control gate with the aid of a layer thickness of the first mask.

In the case of the cell according to the invention, the coupling capacitance can be set exactly by the height of the side walls without the base area of the cell having to be changed. The available base area is very limited in an EPROM cell since the doped regions cannot be covered. Furthermore, it must be taken into account that the dimension of the floating gate influences both the transistor properties and the capacitor properties. The cell according to the invention enables a high integration level while taking into account the boundary conditions.

Other features which are considered as characteristic for the invention are set forth in the appended claims.

Although the invention is illustrated and described herein as embodied in a non-volatile memory cell having a high coupling capacitance and a method for fabricating a semiconductor structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 11(a), (b) to 16 are cross-sectional views through the semiconductor substrate in the first direction (a) and in a second direction (b) for illustrating the steps of the fabrication method for the third embodiment;

DESCRIPTION OF THE PREFERRED EMBODIMENTS

Figure 17:
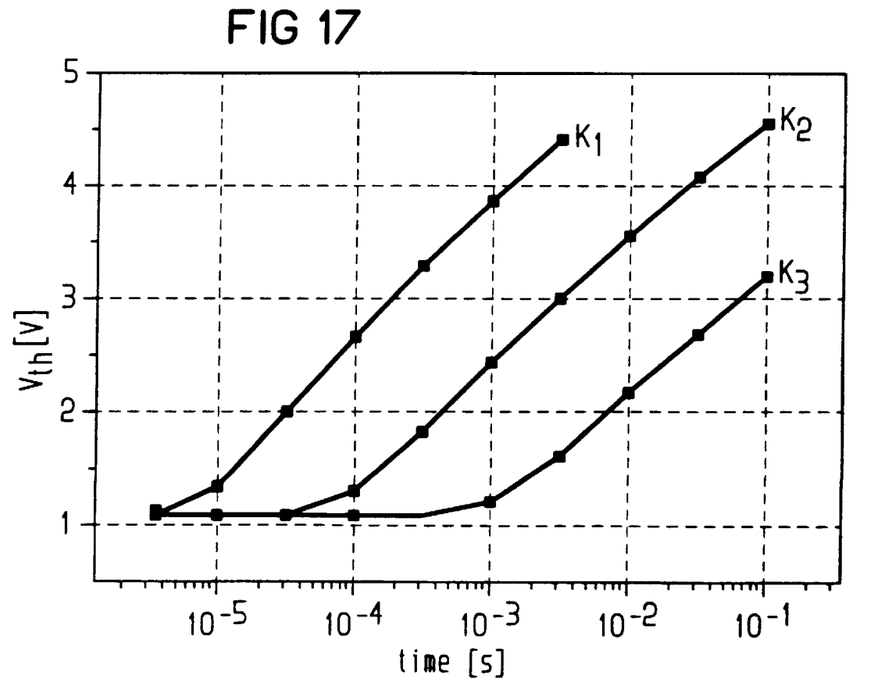
FIG. 17 is a graph showing a change in a threshold voltage over time in a course of an erasing operation for three EPROM cells having coupling capacitances $K_1 > K_2 > K_3$.

Referring now to the figures of the drawing in detail and first, particularly, to FIG. 17 thereof, there is shown changes in a threshold voltage over time during a course of erasure for three different memory cells having three different coupling constants $K_1$, $K_2$, $K_3$, where $K_1>K_2>K_3$. It is evident that the larger capacitance $K_1$ leads to faster changes in the threshold voltage $V_{th}$, in other words the cell is erased more rapidly.

Figure 18A:
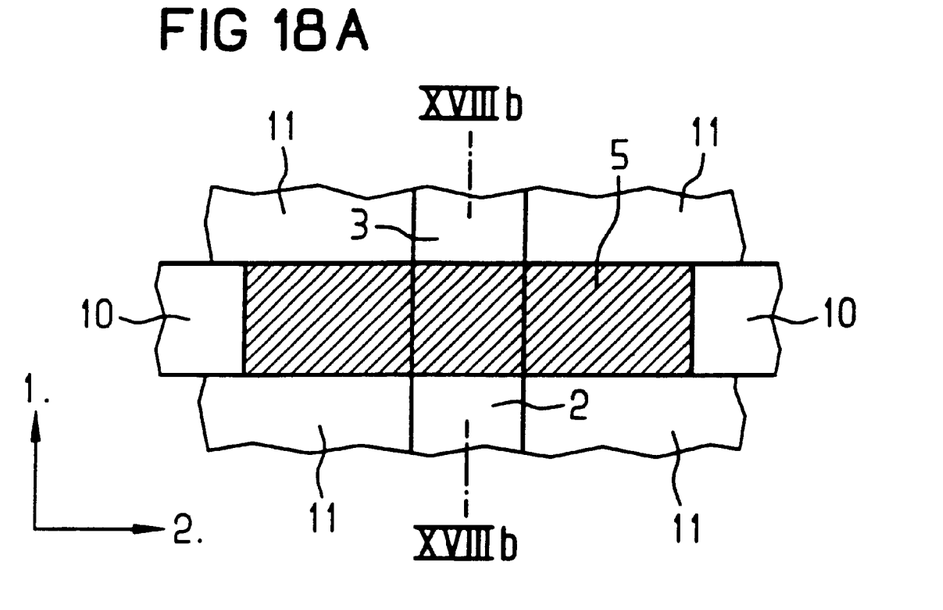
FIGS. 18a and 18b are a plan view and a sectional view respectively through a conventional EEPROM cell.
Figure 18B:
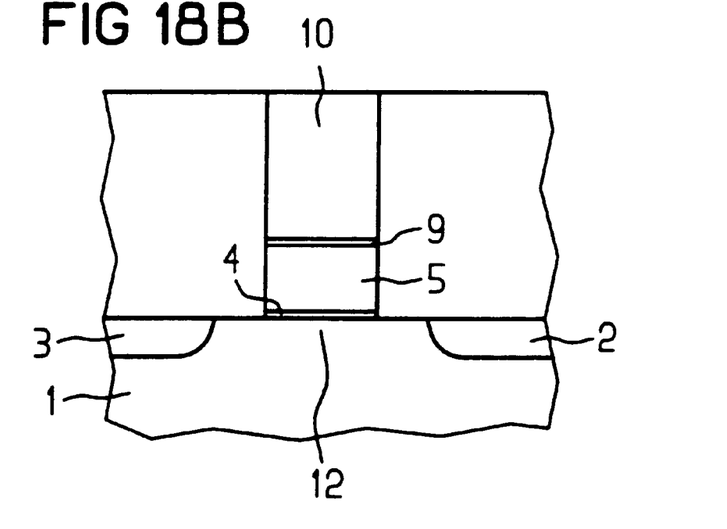

The realization of a large capacitance between a floating gate and a control gate is associated with a large space requirement in known cell configurations in which the control gate is configured in a planar manner on the floating gate. A sufficiently large coupling capacitance is achieved by the lateral extent of the floating gate being much greater than the extent of an active zone (that is to say of doped regions and an intervening channel region) of the cell. FIG. 18a shows a plan view of a conventional prior art cell. The floating gate 5 runs transversely with respect to a first direction 1st, which is defined by a connecting line between the doped regions 2, 3, and extends in a second direction 2nd over an insulation zone 11 surrounding an active zone. The extent of the floating gate 5 is shown by the hatched marks. The control gate 10 runs in the second direction 2nd above the floating gate 5. FIG. 18b shows the configuration in cross section through the active zone of a semiconductor substrate 1 along the first direction 1st. The floating gate 5 and the control gate 10 are separated from one another by a dielectric layer 9, which runs parallel to a surface of the substrate 1. A typical capacitance in $0.6\mu$ technology is approximately 1.9 fF. The requisite area is typically about 3 times as large as a channel region 12, and the integration level in a memory configuration having a multiplicity of neighboring memory cells of this type is thereby limited.

Figure 1:
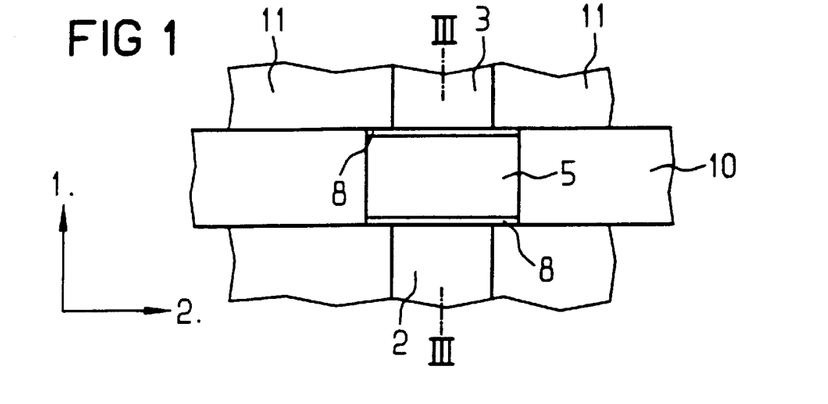
FIGS. 1 and 2 are plan views of first and second embodiments of a semiconductor structure according to the invention.

In FIG. 1 and according to the invention, there is shown a plan view of the semiconductor substrate 1 covered by the active zone of an EEPROM cell. The active zone is defined by a source 2, a drain 3 and the intervening channel region 12. The active region is surrounded by an insulation zone 11. The connecting line between the source 2 and the drain 3 defines the first direction 1st. The channel region 12 is covered by the floating gate 5, which is folded upward at opposite sides in the first direction 1st, so that its side walls 8 extend upward. The control gate 10 in the form of a track runs over the configuration transversely with respect to the first direction 1st. The control gate 10 is applied to the floating gate 5, 8 in a insulated manner. The second direction 2nd is defined by the direction of the control gate 10, in particular, its perpendicular to the first direction 1st.

Possible alignment errors are taken into account in the cell by the fact that the floating gate 5, 8 has a dimension of ⅝ F in the second direction 2nd. In that case, even in the event of a maximum assumed misalignment of ⅓ F, it is ensured that the control gate 10 does not bear on the active zone, but rather is disposed on the floating gate 5. The plan view is intended to illustrate only a position of the active zone, the insulation zone 11, the floating gate 5 and the control gate 10, and therefore only these elements are illustrated.

Figure 2:
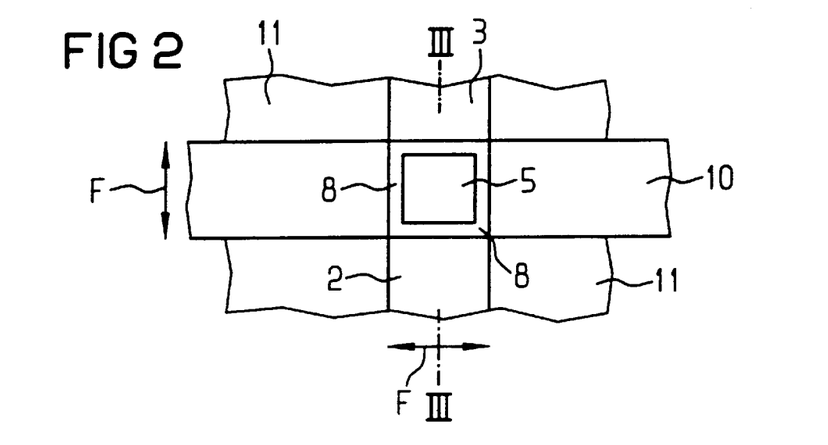

A second embodiment of the memory cell is shown in FIG. 2. The cell has a pot-shaped floating gate 5 in which the side walls 8 are drawn upward on all sides. The extent of the floating gate 5 in the second direction 2nd can be F since, even in the event of an offset relative to the active zone, the control gate 10 bears outside the interior of the pot on a first insulation layer 7 (see FIG. 9).

Figure 3:
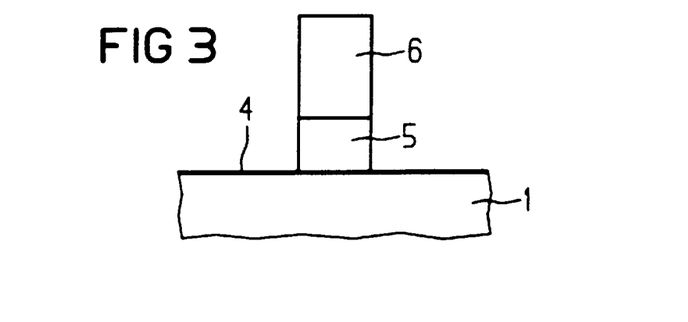
FIGS. 3 to 9 are cross-sectional views through the semiconductor substrate in a first direction or a second direction for illustrating steps of a fabrication method for the first embodiment (FIGS. 3 to 8) and the second embodiment (FIGS. 3 to 7 & 9)

FIG. 3 illustrates that the fabrication method for the first and second embodiments proceeds from the silicon semiconductor substrate 1 with the insulation zone 11 and a thin gate dielectric or tunnel dielectric 4 on its surface. Polysilicon is applied as a first conductive layer 5 for forming the floating gate 5 over the whole area to a thickness of about 200 nm, and a hard mask 6 composed of nitride is produced as a first mask 6 on the polysilicon. The coupling capacitance is set by way of the layer thickness of the first mask 6. In the first embodiment, the first mask 6 has a track of width F which runs in the second direction 2nd transversely over the active zone and has the same course as the control gate 10 shown in FIG. 1. In the second embodiment, it has an island which is aligned with the channel region 12, and is positionally identical to the floating gate 5 in FIG. 2 and preferably has the size F×F. The first conducting layer 5 of polysilicon is etched using the first mask 6.

Figure 4:
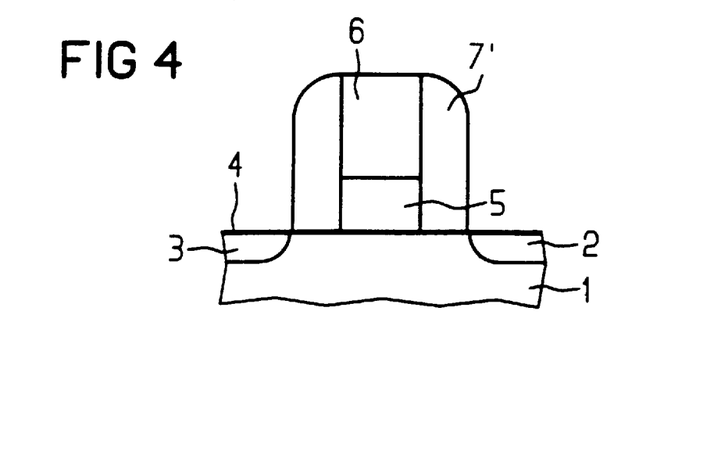

FIG. 4 shows an insulating spacer 7' produced in a known manner on the side walls of the first conductive layer 5 and of the first mask 6 in order to produce the doped regions, the source 2 and the drain 3, in the active zone by suitable implantation. The substrate region between the source 2 and the drain 3 is the channel region 12. The spacer 7' is composed of a different material from the first mask 6, for example of an oxide.

Figure 5:
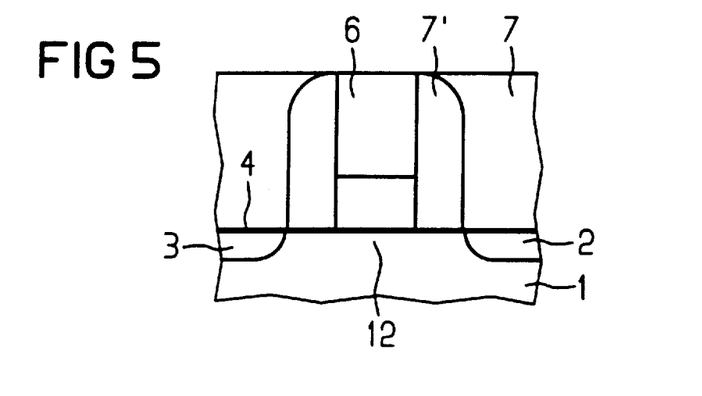

FIG. 5 shows a first insulating layer 7 is applied over the whole region. The first insulating layer 7 is preferably composed of the same material as the spacer 7' and must be different from the material of the first mask 6. The first insulating layer 7, for example a TEOS layer, is planarized, thereby uncovering the surface of the first mask 6. A known planarization method, for example a grounding method (CMP), is used for this purpose.

Figure 6:
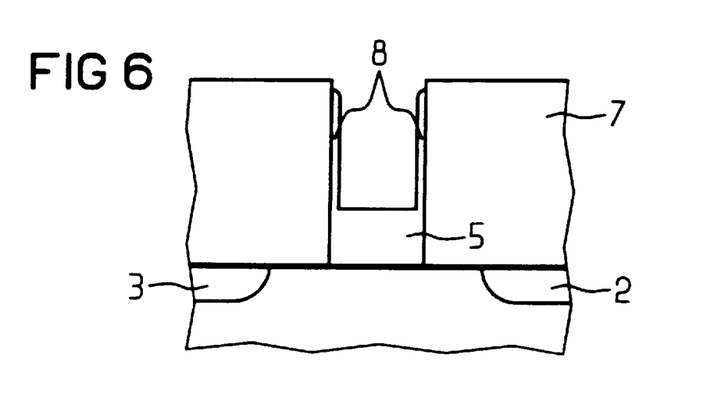

FIG. 6 shows that the first mask 6 is removed by an etching process which is selective with respect to the first insulation layer 7 and with respect to the spacer 7', resulting in a hole in the first insulation layer 7. The hole is trench-shaped in the first embodiment and pot-shaped in the second embodiment. The spacer 7' is no longer illustrated separately from the first insulation layer 7 in the following figures. Polysilicon is applied as a second conductive layer 8 over the whole area to a thickness of about 50 nm, with the result that the side walls and the bottom of the hole are covered. The second conductive layer 8 is subsequently etched back anisotropically, with the result that conductive spacers 8 which are connected to the first conductive layer 5 remain on the side walls of the hole. In the first embodiment, a U-shaped floating gate 5, 8 is therefore formed and extends in the first direction as a track, with the result that, for example, the floating gates 5, 8 of neighboring cells in the first direction are connected to one another. In the second embodiment, a pot-shaped floating gate 5, 8 is formed which is laterally insulated all around by the first insulating layer 7 of TEOS.

Figure 6A:
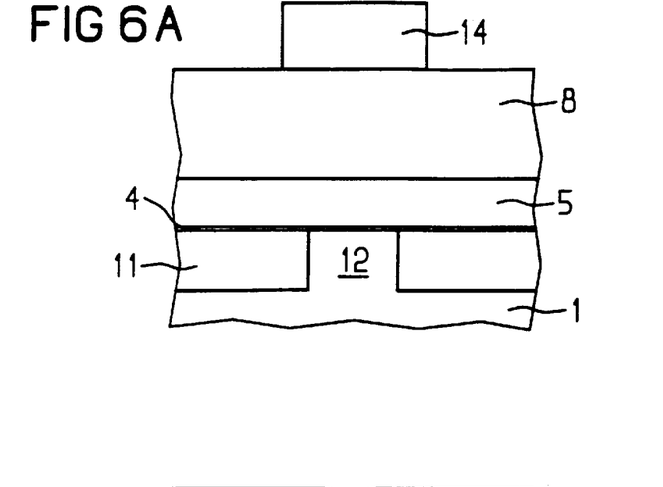

FIG. 6a shows a cross section along the second direction at the edge of the floating gate 5, 8 (through the conductive spacer 8) in the first embodiment. In order to achieve the requisite isolation of neighboring floating gates 5, 8 a second mask 14, which defines the extent of the floating gate 5, 8 in the second direction, is applied to the surface. The second mask 14 preferably has a track of width ⅝ F which runs in the first direction. Using the second mask 14, the second conductive layer 8 and the first conductive layer 5 are etched to form an isolated floating gate 5, 8. A trench in the first insulating layer 7 then adjoins the floating gate 5, 8 in the second direction, which trench reaches vertically as far as the insulation zone 11 and as far as the gate dielectric 4.

Figure 7:
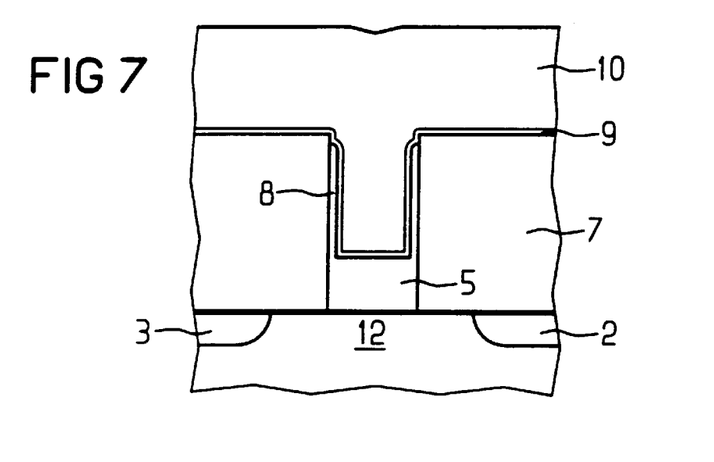

FIG. 7 shows that an ONO layer is applied as dielectric layer 9 in both embodiments. Polysilicon is then deposited as a third conductive layer 10, thereby completely filling the hole.

Figure 8:
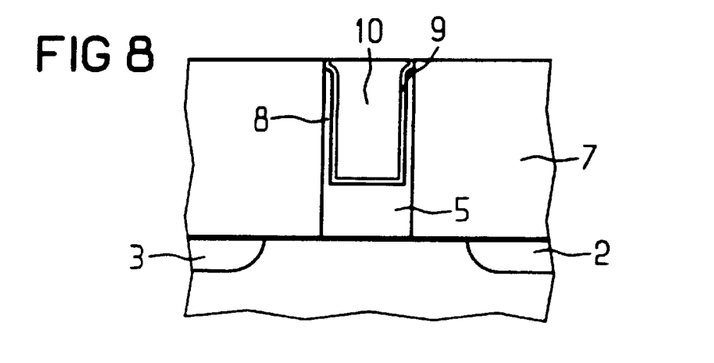

FIG. 8 shows that in the first embodiment, the third conductive layer 10 can be etched back over the whole area, with the result that it remains only in the trench, that is to say within the floating gate 5, 8 or within the first insulating layer 7. The control gate 10 then runs in the trench which was originally defined by the first mask 6, and connects the neighboring cells in the second direction.

Figure 9:
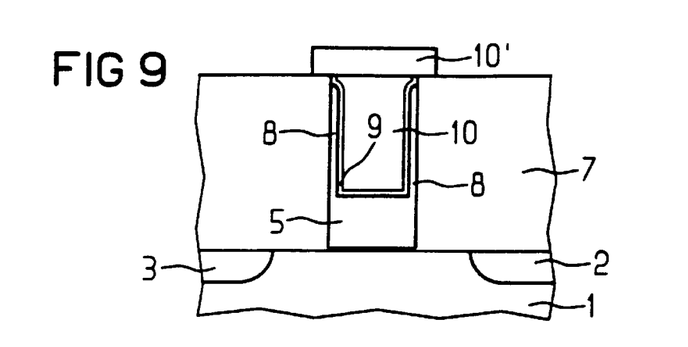

FIG. 9 shows that in the second embodiment, the third conductive layer 10 must be patterned to form a track running in the second direction above the first insulating layer 5, since the control gate 10 must be routed across the side walls of the floating gate 5, 8 which are situated in front of and behind the plane of the drawing. It is also possible firstly to fill, and if appropriate planarize, the pot-shaped hole with the third conductive layer 10, as in FIG. 8, and then to deposit a further conductive layer 10' and pattern it to form a continuous conductive track which interconnects neighboring cells. The further conductive layer 10' and/or the third conductive layer 10 may be composed of polysilicon, tungsten, WSi or TiN.

Figure 10:
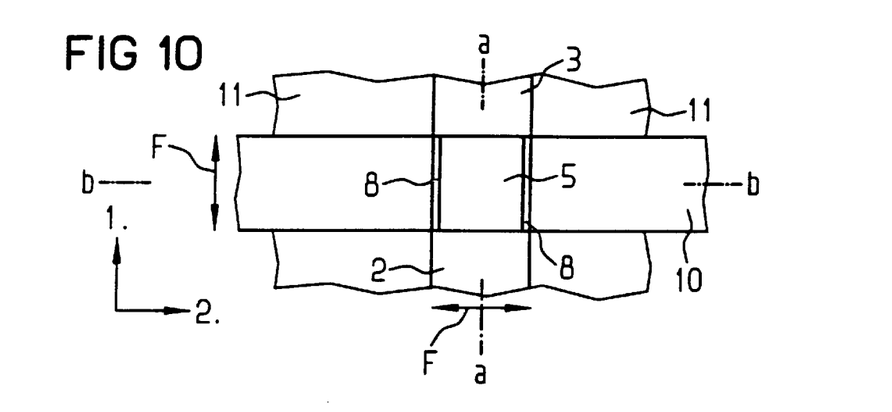
FIG. 10 is a plan view of a third embodiment of the semiconductor structure.

FIG. 10 shows that the floating gate 5, 8 is U-shaped in the third embodiment, the side walls 8 extending upward at the opposite sides in the second direction.

Figure 11:
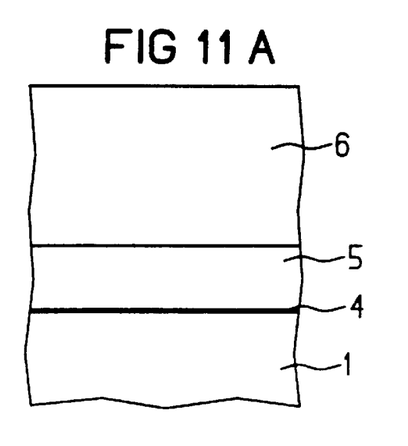

FIGS. 11a and 11b show that the fabrication proceeds from the silicon substrate 1 with the insulation zone 11 and the gate dielectric 4 on its surface. The first conductive layer 5 made of polysilicon and the first mask 6, which is composed of silicon oxide, for example, are applied. The first mask 6 has a track preferably of width F which runs in the first direction and over the active zone. The first conductive layer 5 is etched using the first mask 6. An alignment error would result in the layered structure 5, 6 in FIG. 11b being laterally offset, in other words slightly overlapping the insulation zone 11 and partly leaving the channel region 12 free. However, the uncovered part is covered with the first insulating layer 7 in the following step and, therefore, is not harmful.

Figure 12A:
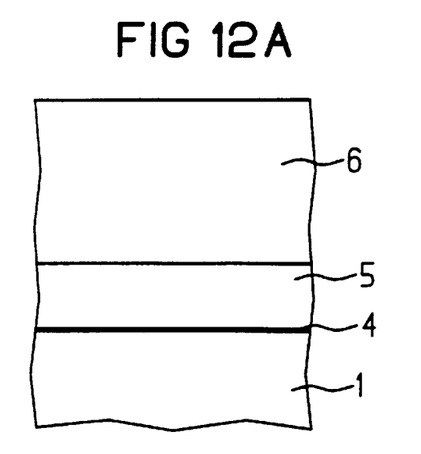
Figure 12B:
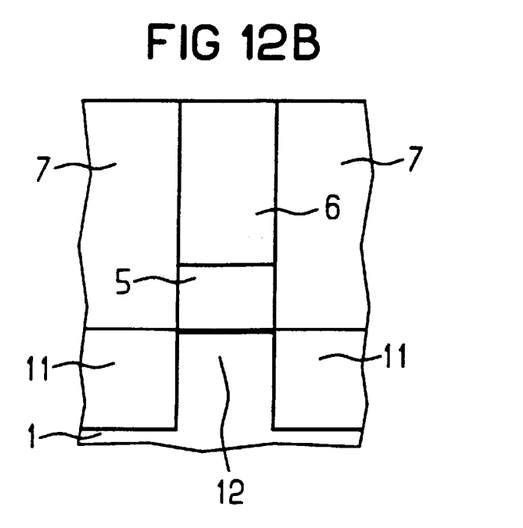

FIG. 12 shows that a silicon nitride is applied as the first insulating layer 7 over the whole area and planarized by CMP, for example, until the surface of the first mask 6 is uncovered. The first insulating layer 7 also covers the insulation zone 11 and, in the event of misalignment of the first mask 6 relative to the active zone, an edge region of the channel region 12 is also covered.

Figure 13A:
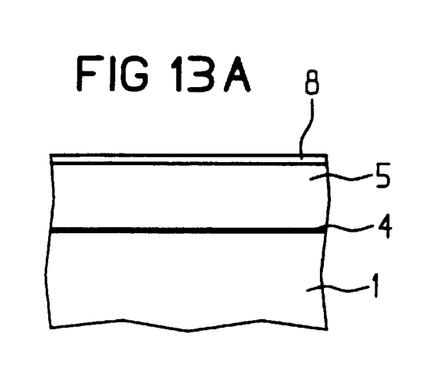
Figure 13B:
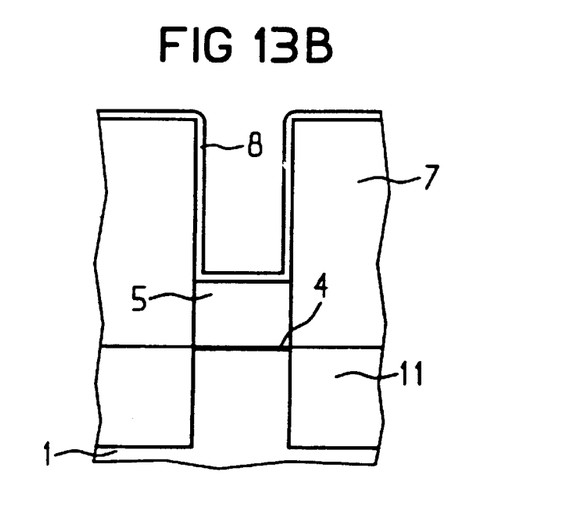

FIG. 13 shows that the oxide forming the first mask 6 is etched selectively with respect to the surrounding first insulating layer 7, thereby producing a trench which runs in the first direction and whose side walls are formed by the first insulating layer 7 and whose bottom is formed by the first conductive layer 5. Polysilicon is then applied as the second conductive layer 8 over the whole area.

Figure 14A:
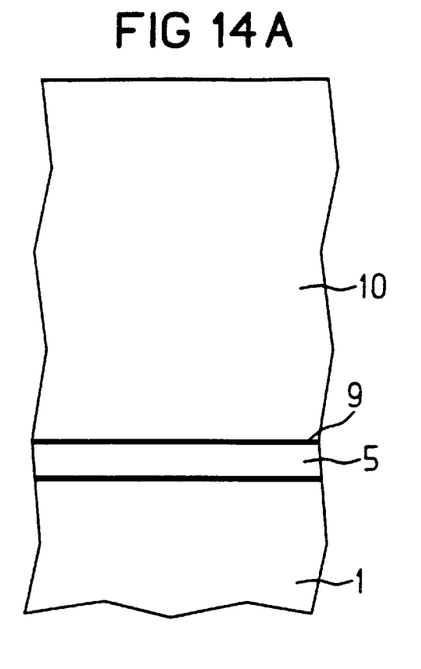
Figure 14B:
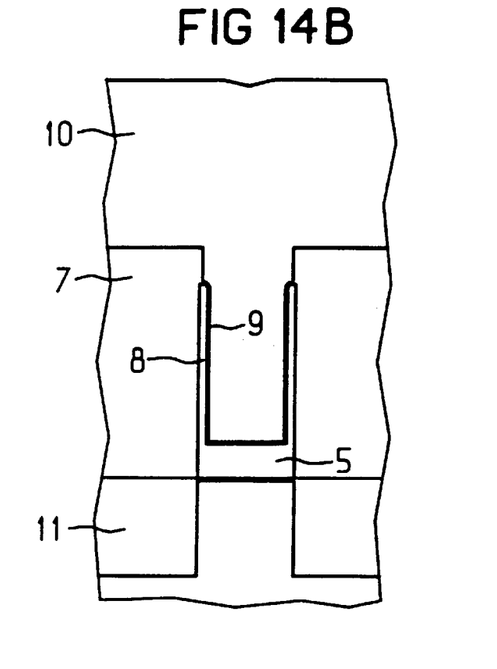

FIG. 14 shows that after the second conductive layer 8 has been etched back over the whole area, the side walls of the trench are still covered with the polysilicon spacer 8 up to a height which is predetermined by the etching time. The bottom is covered with the polysilicon of the first conductive layer 5. The ONO layer as the dielectric layer 9 and polysilicon as the third conductive layer 10 are then applied over the whole area, thereby filling the trench. The polysilicon of the third conductive layer 10 can then be treated with CMP, in which case, however, it remains above the first insulation layer 7 with a thickness that suffices as conductive track, for example 200 nm. As an alternative, it is also possible to remove all of the polysilicon of the third conductive 10 lying above the upper edge of the trench and then to apply a further conductive layer.

Figure 15A:
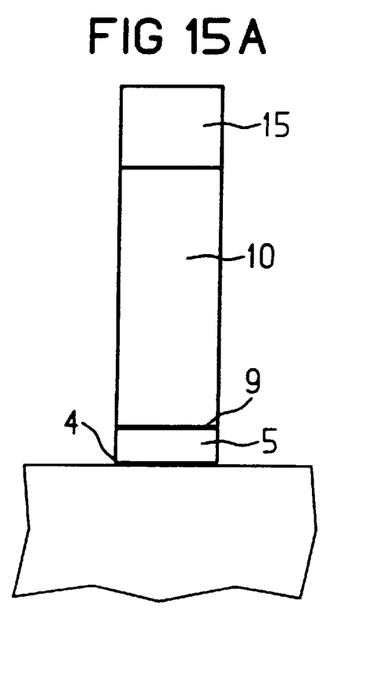
Figure 15B:
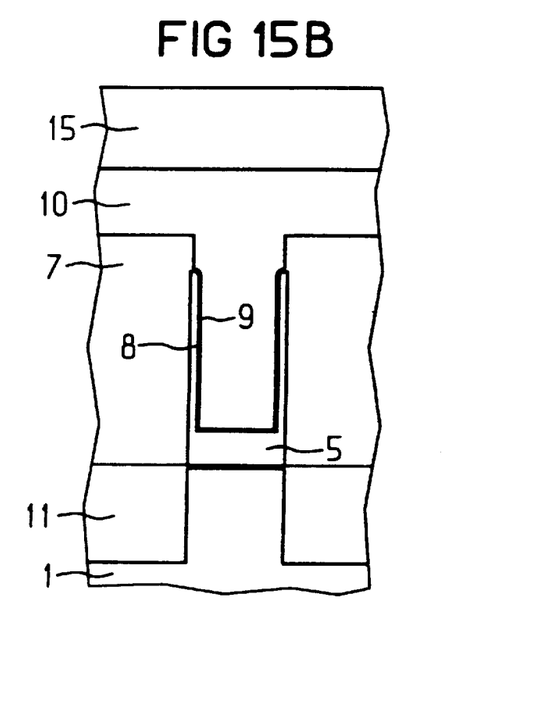

FIG. 15 shows that the third conductive layer 10, the dielectric layer 9 and the first conductive layer 5 are then etched using a further mask 15. The further mask 15 defines the dimension and the position of the control gate 10 formed from the third conductive layer 10, in other words runs in the form of a track in the second direction. At the same time, the dimension of the floating gate 5, 8 in the first direction is defined thereby. The track width is preferably F. The floating gate 5, 8 is produced exactly in the crossover region of the two masks 6, 15 and the channel region 12 is also defined thereby. Misalignment of the further mask 15 is not critical since source and drain are only implanted subsequently using this mask.

Figure 16:
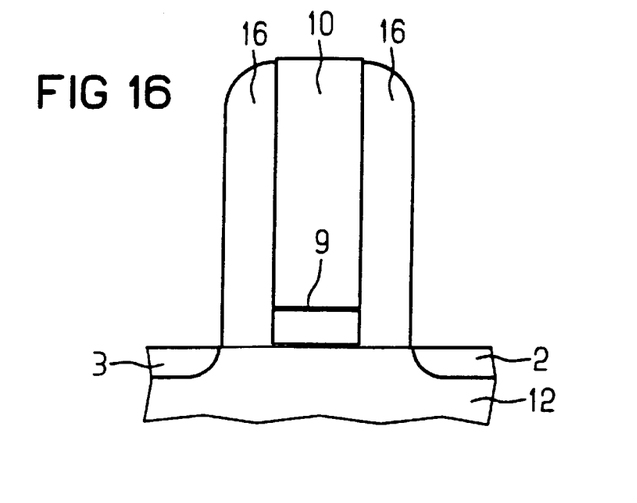

FIG. 16 shows that insulating spacers 16 are produced in a known manner on the side walls 8 of the control gate 5, 8 that has been produced, and then the source 2 and the drain 3 are implanted.

In all three embodiments, the cell is completed in a known manner, in particular by isolation of the control gate 5, 8 and connection metalization of the source 2 and the drain 3.

We claim:

1. A method for fabricating a semiconductor structure, which comprises:
   a) forming a semiconductor substrate of a first conduction type;
   b) forming an active region by disposing first and second doped regions separated from each other by a channel region in the semiconductor substrate, and defining a first direction as a geometrical connecting line running between the doped regions;
   c) laterally surrounding the doped regions and the channel region with an insulation zone;
   d) fabricating a floating gate, including the steps of:
      d1) applying a first conductive layer to a surface of the insulated semiconductor substrate and patterning the first conductive layer using a first mask;
      d2) applying a first insulating layer over the whole insulated semiconductor substrate including the first mask;
      d3) forming a hole in the first insulating layer by uncovering a surface of the first mask and then removing the first mask, the hole uncovering a surface of the first conductive layer; and
      d4) applying a second conductive layer to the uncovered surfaces of the first insulating layer defining the hole;
   e) applying a dielectric layer to a surface of the second conductive layer;
   f) applying a third conductive layer to a surface of the dielectric layer completely filling the hole; and
   g) fabricating a track including a control gate running in a second direction from the third conductive layer.

2. The fabrication method according to claim 1, which comprises:
   performing step d1) by patterning the first conductive layer with the aid of the first mask to form a further track running in the second direction over the channel region; and
   after performing step d4), etching the second conductive layer and the underlying first conductive layer with the aid of a second mask covering the channel region.

3. The fabrication method according to claim 1, which comprises forming insulating spacers on sides of the first mask and of the first conductive layer and aligning the doped regions after the patterning of the first conductive layer.

4. The fabrication method according to claim 1, which comprises:

performing step d1) by patterning the first conductive layer with the aid of the first mask to form a another track running in the first direction over the active region; and etching the third conductive layer, the dielectric layer and the first conductive layer with the aid of a further mask corresponding to a configuration of the control gate for fabricating the control gate.

5. The fabrication method according to claim 1, which comprises applying a further conductive layer on the third conductive layer for connecting neighboring cells to one another as part of the control gate.

6. The fabrication method according to claim 1, which comprises producing the first mask from silicon nitride and the first insulating layer from silicon oxide.

7. The fabrication method according to claim 1, which comprises producing the first mask from silicon oxide and the first insulating layer from silicon nitride.

8. The fabrication method according to claim 1, which comprises uncovering the surface of the first mask by a planarization process.

9. The fabrication method according to claim 1, which comprises forming the first and the second conductive layers of a same material.

10. The fabrication method according to claim 1, which comprises forming the third conductive layer from a material selected from the group consisting of polysilicon, WSi, TiN and tungsten.

11. The fabrication method according to claim 1, which comprises setting a coupling capacitance between the floating gate and the control gate with the aid of a layer thickness of the first mask.

* * * * *